US012641718B2

(12) United States Patent
Dong et al.

(10) Patent No.: US 12,641,718 B2
(45) Date of Patent: May 26, 2026

(54) FLEXIBLE PRINTED CIRCUIT BOARD AND SPEAKER USING SAME

(71) Applicant: AAC Microtech (Changzhou) Co., Ltd., Changzhou (CN)

(72) Inventors: Zhijie Dong, Changzhou (CN); Jinke Liu, Changzhou (CN); Siyuan Ni, Changzhou (CN); Chao Zhang, Changzhou (CN)

(73) Assignee: AAG Microtech (Changzhou) Co., Ltd., Changzhou (CN)

( * ) Notice: Subject to any disclaimer, the term of this patent is extended or adjusted under 35 U.S.C. 154(b) by 369 days.

(21) Appl. No.: 18/314,164

(22) Filed: May 9, 2023

(65) Prior Publication Data

US 2024/0244741 A1      Jul. 18, 2024

Related U.S. Application Data

(63) Continuation of application No. PCT/CN2023/085211, filed on Mar. 30, 2023.

(30) Foreign Application Priority Data

Jan. 16, 2023    (CN) .......................... 202320137295.1

(51) Int. Cl.
*H05K 1/02*          (2006.01)
*H04R 9/06*          (2006.01)
(52) U.S. Cl.
CPC .............. *H05K 1/028* (2013.01); *H04R 9/06* (2013.01)
(58) Field of Classification Search
CPC ........ H05K 1/028; H05K 1/189; H05K 1/118;

H05K 1/0281; H05K 3/32; H05K 2201/05; H05K 2201/2009; H05K 3/287; H05K 1/0283; H05K 2201/0154; H05K 2201/09063; H05K 5/03; H05K 7/20172; H05K 7/2039; H05K 3/28; H05K 7/20972; H05K 1/02; H05K 1/148; H05K 1/184; H05K 1/188; H05K 2201/09445; H05K 2201/0979; H05K 2201/09854; H05K 2201/1034; H05K 3/4676; H05K 1/181; H05K 2201/0314; H05K 2201/09381; H05K 2201/09663; H05K 2201/09727;

(Continued)

(56) References Cited

U.S. PATENT DOCUMENTS 8,975,527 B2 *   3/2015   Takaoka ................. H05K 1/028
                                                                174/254
9,660,365 B2 *   5/2017   Baur ................. H01R 12/7047
                         (Continued)

FOREIGN PATENT DOCUMENTS

CN          110059626 A   *   7/2019   ......... G06V 40/1324
CN          211047208 U   *   7/2020   ............... H04R 1/00
                         (Continued)

*Primary Examiner* — Angelica M McKinney
(74) *Attorney, Agent, or Firm* — Wiersch Law Group

(57) ABSTRACT

The present disclosure discloses a flexible printed circuit board having a high reliability and includes an elastic arm, and a first end and a second end respectively extending from two ends of the elastic arm. A part of the elastic arm is provided with a thinning portion for changing stiffness distributions of the elastic arm during vibrating. The present disclosure also discloses a speaker using the flexible printed circuit board.

5 Claims, 4 Drawing Sheets

(58) Field of Classification Search
CPC .......... H05K 2201/10053; H05K 2201/10128; H05K 2201/10151; H05K 2203/068; H05K 3/281; H05K 3/284; H05K 3/321; H05K 3/3405; H05K 3/363; H05K 7/20163; H05K 7/20963; H05K 1/0218; H05K 1/023; H05K 1/0277; H05K 1/0393; H05K 1/095; H05K 1/14; H05K 2201/0108; H05K 2201/0129; H05K 2201/0145; H05K 2201/0218; H05K 2201/0715; H05K 2201/091; H05K 2201/09118; H05K 2201/09781; H05K 2201/09909; H05K 2201/10371; H05K 2201/2027; H05K 2203/1327; H05K 3/0014; H05K 3/1216; H05K 3/1283; H05K 3/181; H05K 3/323; H05K 3/384; H05K 3/4694; H05K 9/0007; H05K 9/0024; H05K 9/0049; H05K 9/0081; H05K 1/0271; H05K 3/4691; H05K 1/00; H04R 9/06; H04R 9/025; H04R 2460/13; H04R 1/02; H04R 1/028; H04R 1/04; H04R 1/06; H04R 1/10; H04R 1/1008; H04R 1/1033; H04R 1/1041; H04R 1/105; H04R 1/1058; H04R 1/1075; H04R 1/1083; H04R 1/28; H04R 2201/107; H04R 25/65; H04R 9/02; H04R 9/066; H04R 1/023; H04R 2410/01; H04R 2410/07; H04R 7/12; H04R 9/047; H04R 1/288; G06V 40/1318; G06V 40/1324; H01R 12/7047
See application file for complete search history.

(56) References Cited

U.S. PATENT DOCUMENTS

| | | | | | |
|---|---|---|---|---|---|
| 11,212,913 | B2 * | 12/2021 | Harada | ............... | H05K 1/0271 |
| 11,917,362 | B2 * | 2/2024 | Yang | ...................... | H04R 1/288 |
| 12,238,500 | B2 * | 2/2025 | Yang | ...................... | H05K 1/028 |
| 2009/0242243 | A1 * | 10/2009 | Bagung | .................. | H05K 1/028 |
| | | | | | 29/829 |
| 2012/0170792 | A1 * | 7/2012 | Li | ........................... | H04R 9/066 |
| | | | | | 381/412 |
| 2012/0186860 | A1 * | 7/2012 | Takaoka | ................ | H05K 1/028 |
| | | | | | 174/254 |
| 2015/0373830 | A1 * | 12/2015 | Miyagawa | ........... | H05K 1/0281 |
| | | | | | 174/254 |

FOREIGN PATENT DOCUMENTS

| | | | | | | |
|---|---|---|---|---|---|---|
| CN | | 111246661 | B | * | 8/2020 | ............... H04R 9/06 |
| CN | | 112449288 | A | * | 3/2021 | ............. H04R 9/025 |

* cited by examiner

10

20

A-A

FLEXIBLE PRINTED CIRCUIT BOARD AND SPEAKER USING SAME

FIELD OF THE PRESENT DISCLOSURE

The present disclosure relates to printed circuit boards, in particular to a flexible printed circuit board and a speaker using the flexible printed circuit board.

DESCRIPTION OF THE RELATED ART

A flexible printed circuit board in the related art includes an elastic arm. The elastic arm has the same thickness everywhere. In actual use, some parts of the elastic arm with smaller stiffness are prone to fatigue during vibrating, resulting in a fracture risk of the elastic arm. However, due to a limitation of a space where the flexible printed circuit board is located, it is impossible to change a shape of the flexible printed circuit board to overcome the fracture risk, resulting in a low reliability of the flexible printed circuit board in the related art.

Thus, it is necessary to provide a novel flexible printed circuit board to solve the problem.

SUMMARY

An objective of the present disclosure is to overcome the above technical problem and provide a flexible printed circuit board having a high reliability.

In order to achieve the objective mentioned above, the present disclosure discloses a flexible printed circuit board including an elastic arm, and a first end and a second end respectively extending from two ends of the elastic arm. A part of the elastic arm is provided with a thinning portion for changing stiffness distributions of the elastic arm during vibrating.

As an improvement, the flexible printed circuit board includes a coating layer and a conductive layer combined with the coating layer. The thinning portion is formed by thinning the coating layer of the part of the elastic arm.

The present disclosure also discloses a speaker including the flexible printed circuit board.

As an improvement, the speaker further includes a frame, a vibration system fixed to the frame, and a magnetic circuit system fixed to the frame. The vibration system includes a diaphragm and a voice coil for driving the diaphragm to vibrate and emit sounds. The magnetic circuit system includes a bottom plate, a first magnet disposed on the bottom plate, and a second magnet disposed on the bottom plate and spaced apart from the first magnet for forming a magnetic gap. The second magnet is provided with a first gap. The flexible printed circuit board is arranged in the first gap. The first end of the flexible printed circuit board is fixed to the frame. The second end of the flexible printed circuit board is fixed to the voice coil.

As an improvement, an amount of the second magnets is four. The four second magnets surround the first magnet. Each two adjacent second magnets form the first gap.

As an improvement, the magnetic circuit system further includes a first yoke disposed on the first magnet and a second yoke disposed on the second magnet. The second yoke is provided with a second gap corresponding to the first gap.

In the flexible printed circuit board according to the present disclosure, the thinning portion can change stiffness distributions of the elastic arm during vibrating. By thinning a part of the elastic arm with larger stiffness during vibrating, a thickness of the elastic arm in the part is reduced, thereby changing stiffness distributions of the elastic arm during vibrating and balancing the overall stress of the elastic arm. Thus, the elastic arm is not prone to fatigue, thereby reducing the fracture risk of the elastic arm and improving the reliability of the flexible printed circuit board. In addition, since the elastic arm is just partly thinned without changing the shape thereof, the flexible printed circuit board has a good applicability.

BRIEF DESCRIPTION OF THE DRAWINGS

In order to more clearly illustrate the technical solutions in embodiments of the present disclosure, the accompanying drawings used in the description of the embodiments will be briefly introduced below. It is apparent that, the accompanying drawings in the following description are only some embodiments of the present disclosure, and other drawings can be obtained by those of ordinary skill in the art based on the accompanying drawings without creative efforts, wherein.

DETAILED DESCRIPTION OF THE EMBODIMENTS

The technical solutions in embodiments of the present disclosure will be described clearly and completely below with reference to the accompanying drawings in the embodiments of the present disclosure. It is apparent that, the described embodiments are merely some of rather than all of the embodiments of the present disclosure. All other embodiments acquired by those of ordinary skill in the art without creative efforts based on the embodiments of the present disclosure shall fall within the protection scope of the present disclosure.

Figure 1:
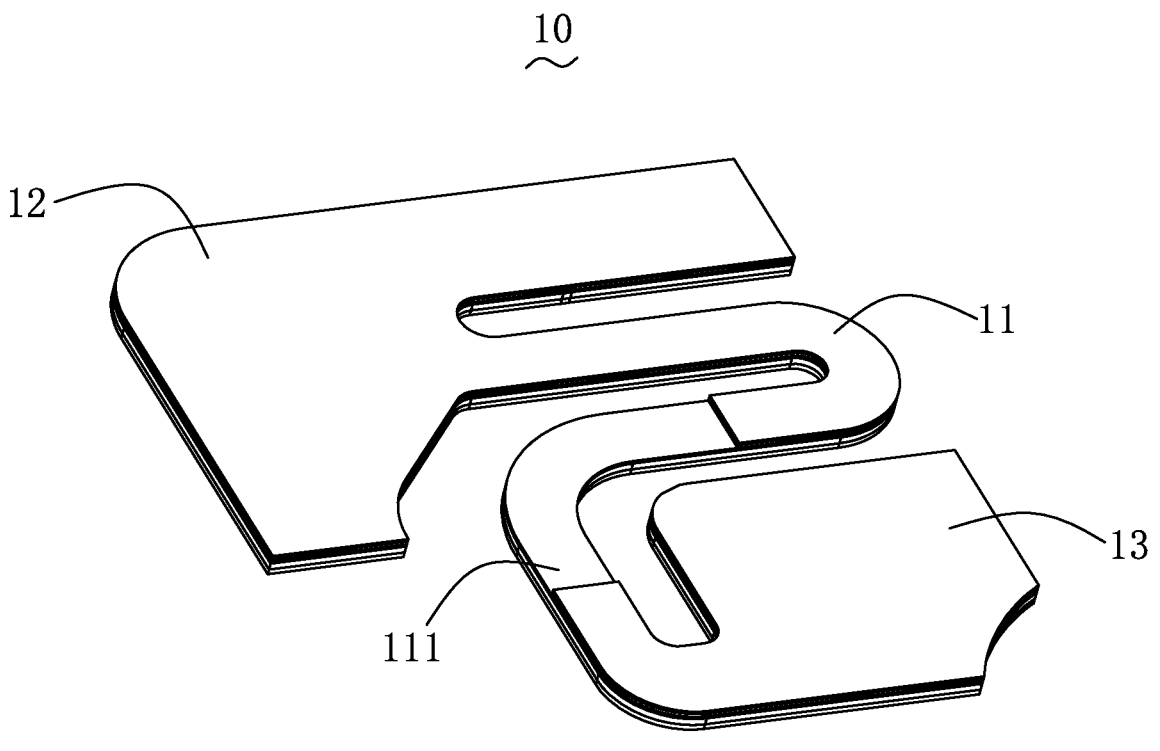
FIG. 1 is an isometric view of a flexible printed circuit board in accordance with an exemplary embodiment of the present disclosure.
Figure 2:
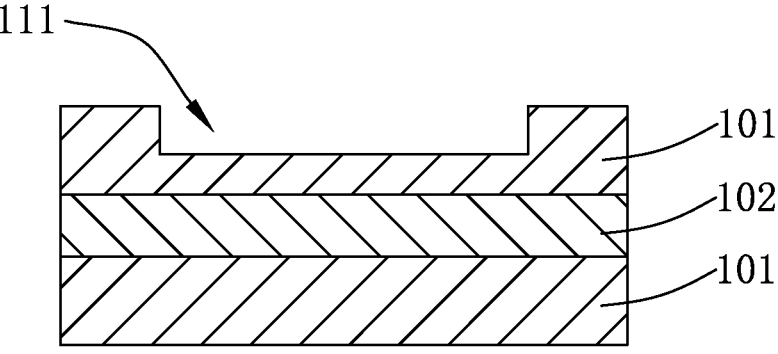
FIG. 2 is a structural schematic diagram of the flexible printed circuit board in FIG. 1.
Figure 3:
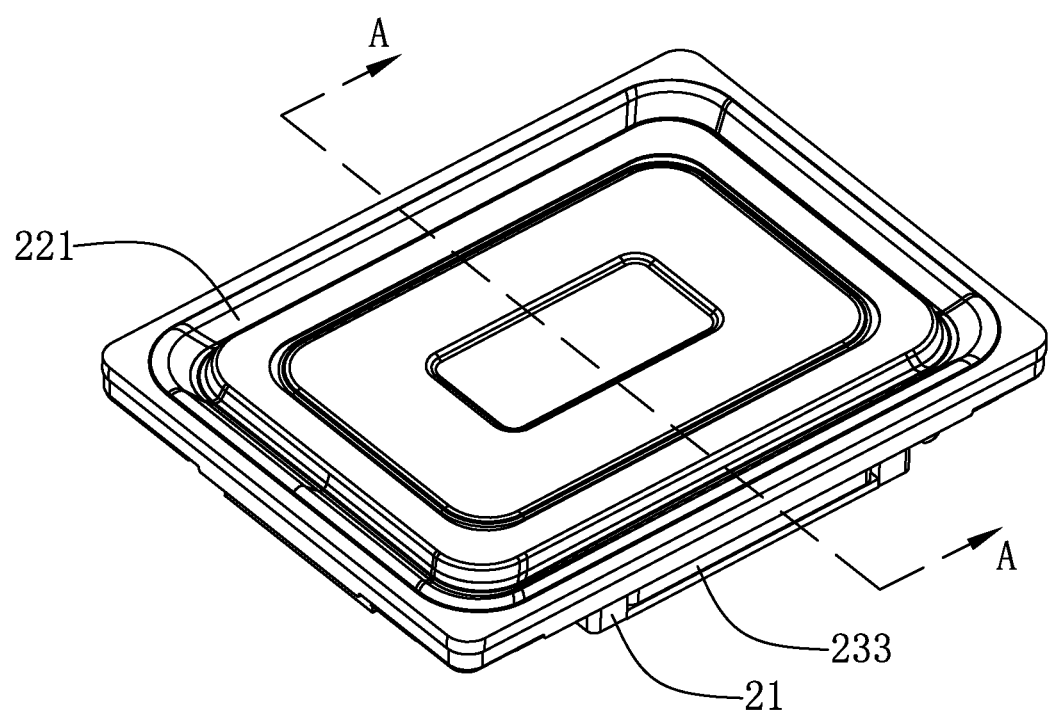
FIG. 3 is an isometric view of a speaker in accordance with an exemplary embodiment of the present disclosure.
Figure 4:
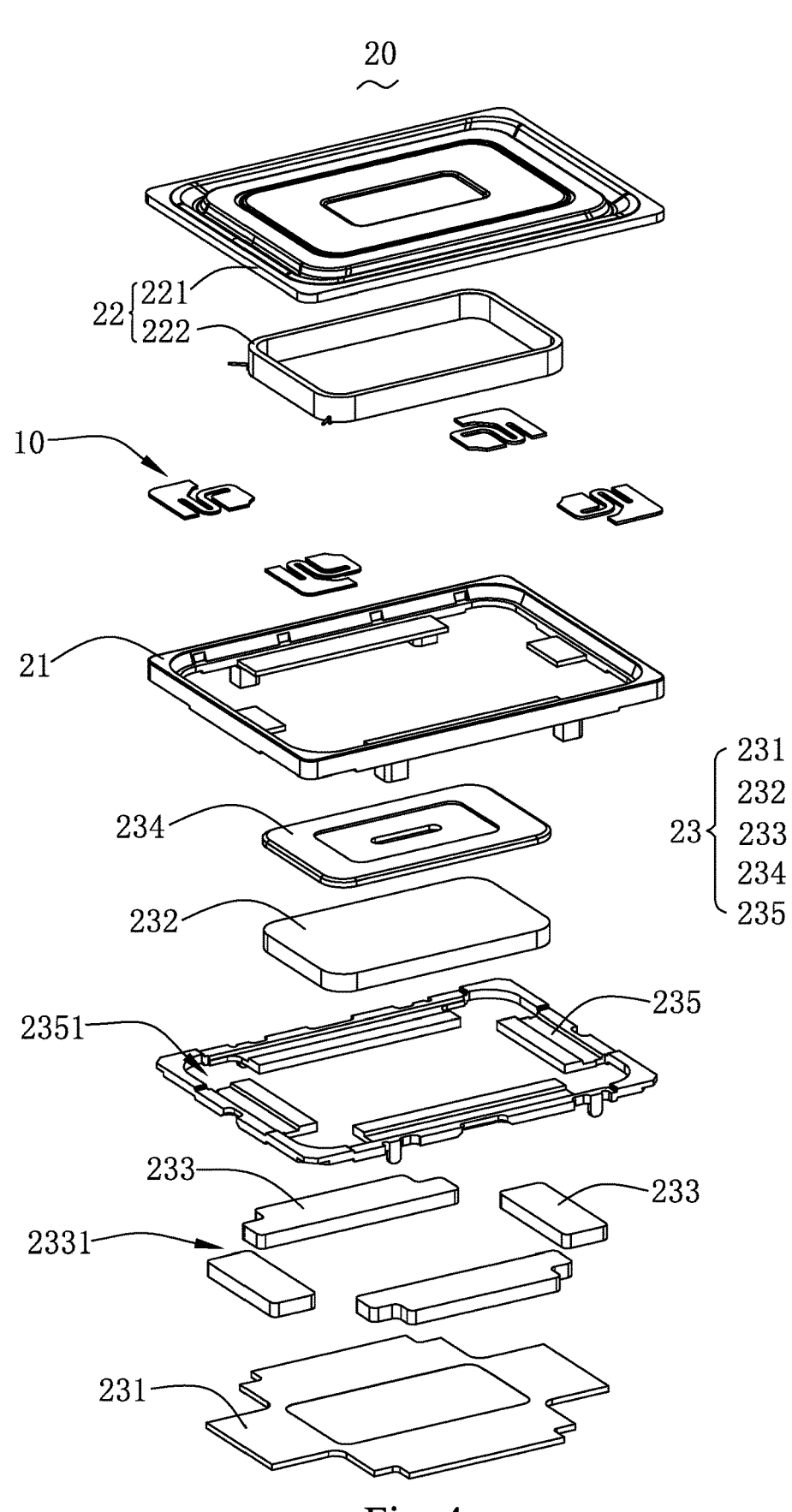
FIG. 4 is an exploded view of the speaker in FIG. 3.
Figure 5:
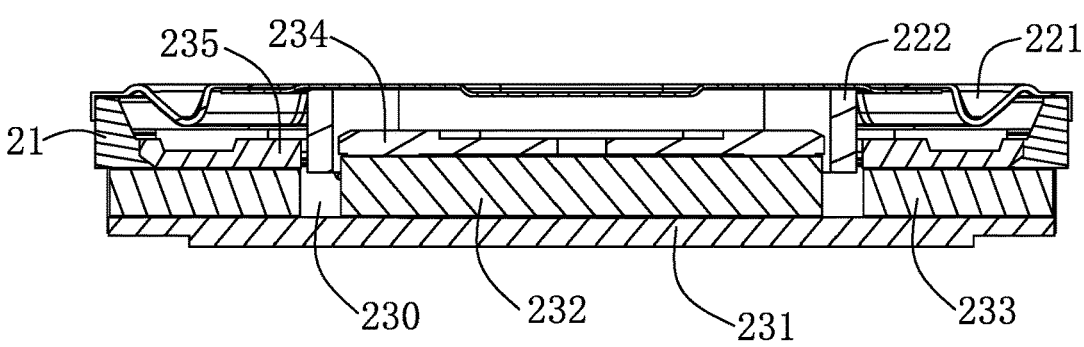
FIG. 5 is a cross-sectional view of the speaker, taken along line A-A in FIG. 3.
Figure 6:
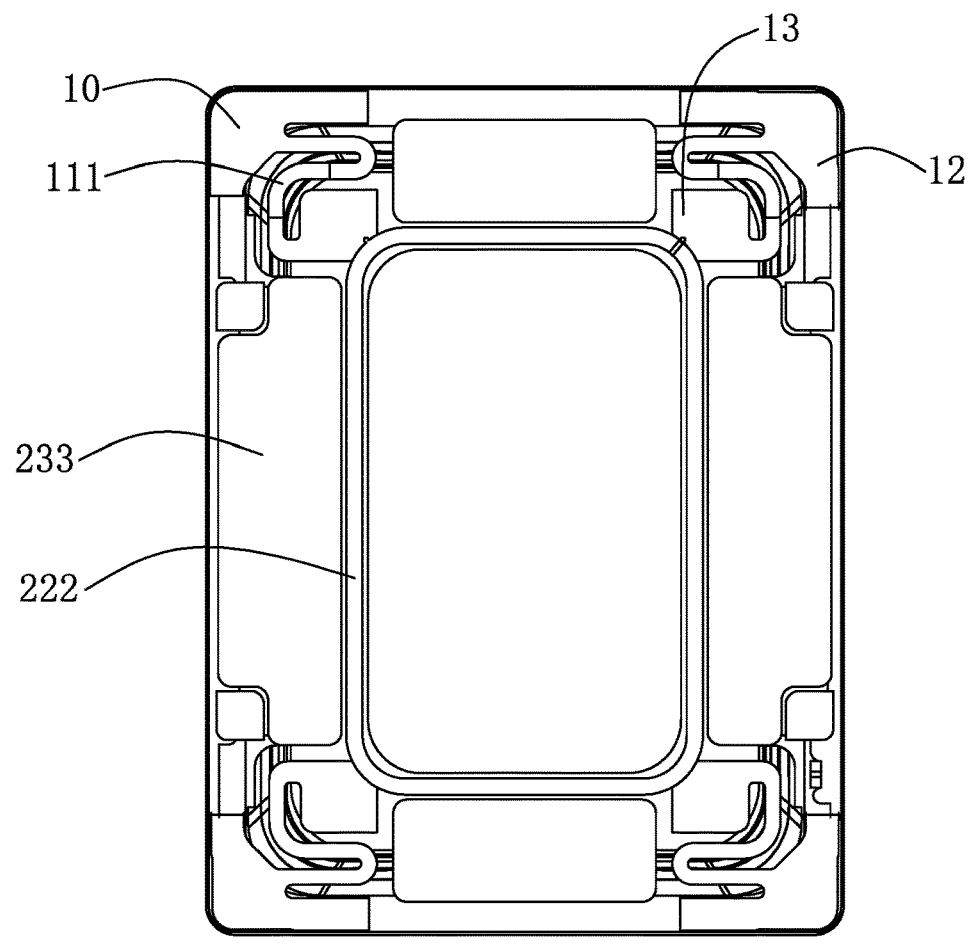
FIG. 6 is an isometric view of the speaker in FIG. 3, removing a bottom plate.

Referring to FIGS. 1-2, the present disclosure discloses a flexible printed circuit board 10 including an elastic arm 11, and a first end 12 and a second end 13 respectively extending from two ends of the elastic arm 11. A part of the elastic arm 11 is provided with a thinning portion 111 for changing stiffness distributions of the elastic arm 11 during vibrating.

The flexible printed circuit board 10 includes a coating layer 101 and a conductive layer 102 combined with the coating layer 101. The thinning portion 111 is formed by thinning the coating layer 101 of the part of the elastic arm 11.

The coating layer 101 can be a single layer, or stacked multiple layers. The thinning portion 111 can be formed on one side surface of the flexible printed circuit board 10, or can be formed on both sides of the flexible printed circuit board 10.

Referring to FIGS. 3-6, the present disclosure also discloses a speaker 20. The speaker 20 includes the flexible printed circuit board 10.

The speaker 20 further includes a frame 21, a vibration system 22 fixed to the frame 21, and a magnetic circuit system 23 fixed to the frame 21. The vibration system 22 includes a diaphragm 221 and a voice coil 222 for driving the diaphragm 221 to vibrate and emit sounds. The magnetic circuit system 23 includes a bottom plate 231, a first magnet 232 disposed on the bottom plate 231, and a second magnet 233 disposed on the bottom plate 231 and spaced apart from the first magnet 232 for forming a magnetic gap 230. The voice coil 222 locates in the magnetic gap 230. The second magnet 233 is provided with a first gap 2331. The flexible printed circuit board 10 is arranged in the first gap 2331. The first end 12 of the flexible printed circuit board 10 is fixed to the frame 21. The second end 13 of the flexible printed circuit board 10 is fixed to the voice coil 222.

In this embodiment, an amount of the second magnets 233 is four. The four second magnets 233 surround the first magnet 232. Each two adjacent second magnets 233 form the first gap 2331.

The magnetic circuit system 23 further includes a first yoke 234 disposed on the first magnet 232 and a second yoke 235 disposed on the second magnet 233. The second yoke 235 is provided with a second gap 2351 corresponding to the first gap 2331.

It should be noted that the flexible printed circuit board 10 can also be used in other electronic devices, as long as the flexible printed circuit board 10 participates in vibration and provides electrical connections, for example, a vibration motor, etc.

In the flexible printed circuit board 10 according to the present disclosure, the thinning portion 111 can change stiffness distributions of the elastic arm 11 during vibrating. By thinning a part of the elastic arm 11 with larger stiffness during vibrating, a thickness of the elastic arm 11 in the part is reduced, thereby changing stiffness distributions of the elastic arm 11 during vibrating and balancing the overall stress of the elastic arm 11. Thus, the elastic arm 11 is not prone to fatigue, thereby reducing the fracture risk of the elastic arm 11 and improving the reliability of the flexible printed circuit board 10. In addition, since the elastic arm 11 is just partly thinned without changing the shape thereof, the flexible printed circuit board 10 has a good applicability.

The above are only embodiments of the present disclosure. It should be pointed out that those of ordinary skill in the art may also make improvements without departing from the ideas of the present disclosure, all of which fall within the protection scope of the present disclosure.

What is claimed is:

1. A flexible printed circuit board, comprising an elastic arm, and a first end and a second end respectively extending from two ends of the elastic arm, wherein a part of the elastic arm is provided with a thinning portion for changing stiffness distributions of the elastic arm in order to achieve a stress balance on the entire elastic arm during vibration, wherein the flexible printed circuit board comprises a coating layer and a conductive layer combined with the coating layer, and the thinning portion is formed by thinning the coating layer of the part of the elastic arm.

2. A speaker, comprising the flexible printed circuit board as described in claim 1.

3. The speaker as described in claim 2, further comprising a frame, a vibration system fixed to the frame, and a magnetic circuit system fixed to the frame, wherein the vibration system comprises a diaphragm and a voice coil for driving the diaphragm to vibrate and emit sounds, the magnetic circuit system comprises a bottom plate, a first magnet disposed on the bottom plate, and a second magnet disposed on the bottom plate and spaced apart from the first magnet for forming a magnetic gap, the second magnet is provided with a first gap, the flexible printed circuit board is arranged in the first gap, the first end of the flexible printed circuit board is fixed to the frame, the second end of the flexible printed circuit board is fixed to the voice coil.

4. The speaker as described in claim 3, wherein an amount of the second magnets is four, the four second magnets surround the first magnet, each two adjacent second magnets form the first gap.

5. The speaker as described in claim 3, wherein the magnetic circuit system further comprises a first yoke disposed on the first magnet and a second yoke disposed on the second magnet, the second yoke is provided with a second gap corresponding to the first gap.

* * * * *